US010715102B2

(12) United States Patent
Takeshita

(10) Patent No.: US 10,715,102 B2
(45) Date of Patent: Jul. 14, 2020

(54) FILTER DEVICE

(71) Applicant: Murata Manufacturing Co., Ltd., Nagaokakyo-shi, Kyoto-fu (JP)

(72) Inventor: Toru Takeshita, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 134 days.

(21) Appl. No.: 16/001,971

(22) Filed: Jun. 7, 2018

(65) Prior Publication Data

US 2018/0287588 A1    Oct. 4, 2018

Related U.S. Application Data

(63) Continuation of application No. PCT/JP2016/080989, filed on Oct. 19, 2016.

(30) Foreign Application Priority Data

Dec. 24, 2015    (JP) .................... 2015-251913

(51) Int. Cl.
*H03H 9/05* (2006.01)
*H01L 23/00* (2006.01)
(Continued)

(52) U.S. Cl.
CPC ............. *H03H 9/059* (2013.01); *H01L 23/00* (2013.01); *H03H 9/02559* (2013.01);
(Continued)

(58) Field of Classification Search
CPC .......... H03H 9/02559; H03H 9/02921; H03H 9/0576; H03H 9/059; H03H 9/1064;
(Continued)

(56) References Cited

U.S. PATENT DOCUMENTS 8,805,299 B2 *  8/2014  Uejima ................. H03H 7/463
                                                      455/552.1
2008/0122554 A1 *  5/2008  Harada ............... H03H 9/0561
                                                      333/25
(Continued)

FOREIGN PATENT DOCUMENTS

JP    2005-130412 A    5/2005
JP    2010-118828 A    5/2010
(Continued)

OTHER PUBLICATIONS

English language machine translation of JP 2010-118828A, published May 27, 2010, 10 pages. (Year: 2010).*
(Continued)

*Primary Examiner* — Barbara Summons
(74) *Attorney, Agent, or Firm* — Keating & Bennett, LLP

(57) ABSTRACT

A filter device includes a first filter chip including a first signal terminal and a second filter chip including a second signal terminal that are mounted above a package substrate including a substrate main body. First and second signal electrode pads are provided on a first main surface of the package substrate and are respectively joined to the first and second signal terminals. First and second outer terminals are provided on a second main surface of the substrate main body. The first and second signal electrode pads and the first and second outer terminals are connected to each other with first and second wirings, respectively. The second outer terminal is located at the first signal electrode pad side and the first outer terminal is located at the second signal electrode pad side when seen from above.

21 Claims, 5 Drawing Sheets

(51) Int. Cl.
*H03H 9/02* (2006.01)
*H03H 9/25* (2006.01)
*H03H 9/10* (2006.01)
*H03H 9/145* (2006.01)
*H03H 9/64* (2006.01)
*H03H 9/72* (2006.01)

(52) U.S. Cl.
CPC ...... *H03H 9/02921* (2013.01); *H03H 9/0576* (2013.01); *H03H 9/1064* (2013.01); *H03H 9/145* (2013.01); *H03H 9/25* (2013.01); *H03H 9/6483* (2013.01); *H03H 9/6489* (2013.01); *H03H 9/725* (2013.01); *H01L 2224/16225* (2013.01)

(58) Field of Classification Search
CPC ........ H03H 9/145; H03H 9/25; H03H 9/6483; H03H 9/6489; H03H 9/725; H03H 9/0557; H03H 9/0561; H03H 9/0566; H03H 9/0571; H03H 9/1085; H03H 9/6433; H03H 9/70; H03H 9/703; H03H 9/706; H03H 9/72; H01L 23/00; H01L 2224/16225
USPC ........................................ 333/133
See application file for complete search history.

(56) References Cited

U.S. PATENT DOCUMENTS

| | | | |
|---|---|---|---|
| 2010/0060372 | A1 | 3/2010 | Funahashi et al. |
| 2011/0175689 | A1* | 7/2011 | Omura ................. H03H 9/0576 333/133 |
| 2012/0068790 | A1 | 3/2012 | Yoshimoto |
| 2012/0297595 | A1* | 11/2012 | Inoue ..................... H01L 24/97 29/25.35 |
| 2013/0106530 | A1* | 5/2013 | Tajima ................. H03H 9/0571 333/133 |
| 2013/0187730 | A1* | 7/2013 | Nishizawa ............... H03H 9/54 333/193 |
| 2015/0280689 | A1* | 10/2015 | Nakamura ......... H03H 9/02818 333/195 |
| 2018/0248535 | A1* | 8/2018 | Koreeda .................. H03H 9/25 |

FOREIGN PATENT DOCUMENTS

| | | |
|---|---|---|
| JP | 2012-065272 A | 3/2012 |
| JP | 2015-146333 A | 8/2015 |
| WO | 2008/146552 A1 | 12/2008 |

OTHER PUBLICATIONS

Official Communication issued in International Patent Application No. PCT/JP2016/080989, dated Dec. 20, 2016.

* cited by examiner

FIG. 5A
FIG. 5C
FIG. 5B
FIG. 5D
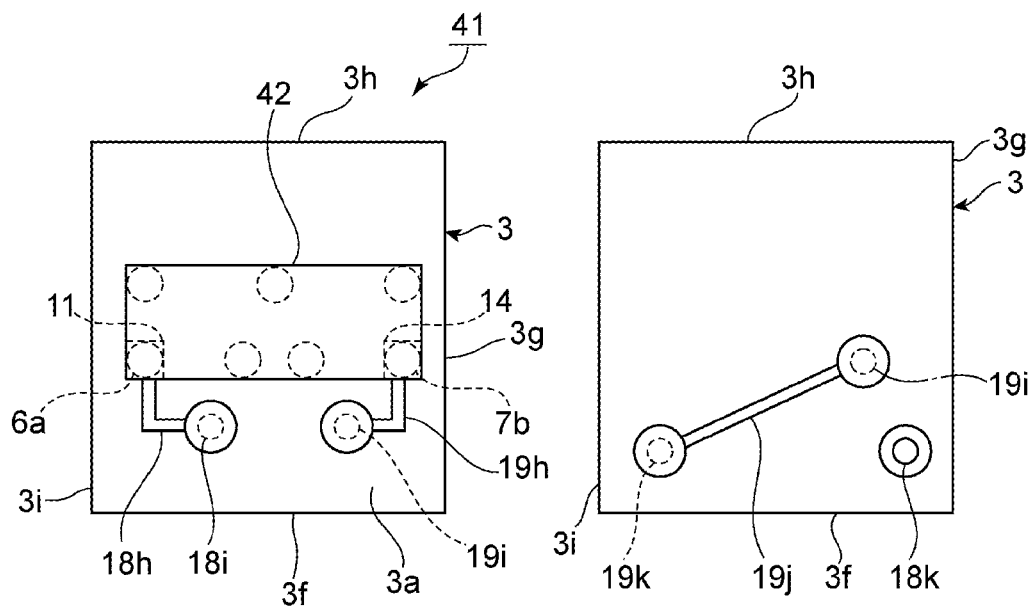
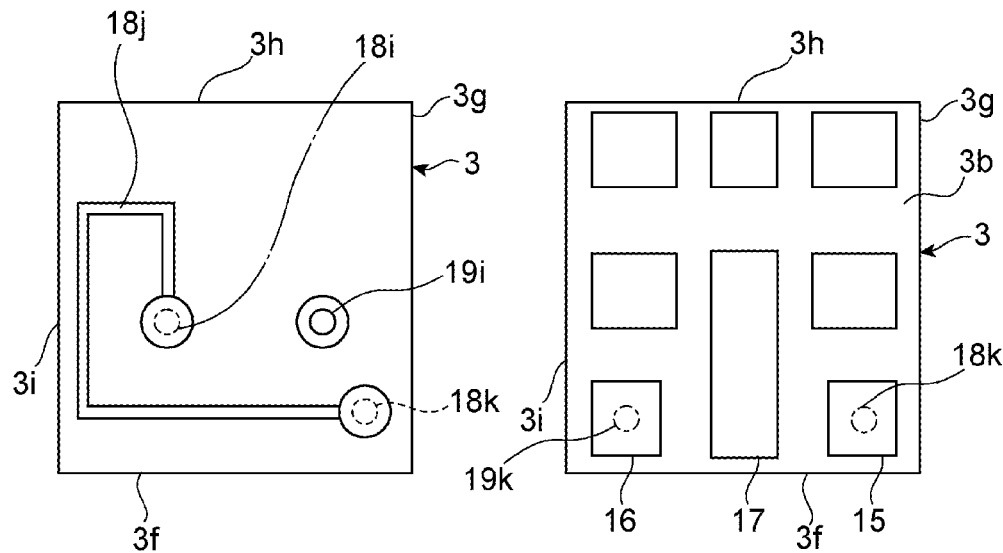

FILTER DEVICE

CROSS REFERENCE TO RELATED APPLICATIONS

This application claims the benefit of priority to Japanese Patent Application No. 2015-251913 filed on Dec. 24, 2015 and is a Continuation Application of PCT Application No. PCT/JP2016/080989 filed on Oct. 19, 2016. The entire contents of each application are hereby incorporated herein by reference.

BACKGROUND OF THE INVENTION

1. Field of the Invention

The present invention relates to a filter device, such as an elastic wave filter, for example.

2. Description of the Related Art

WO08/146552 discloses a duplexer including a transmission filter and a reception filter. To be specific, a surface acoustic wave filter chip defining the transmission filter and a surface acoustic wave filter chip defining the reception filter are mounted on/above a substrate, a signal terminal of the transmission filter is joined to a transmission signal electrode pad on the substrate, and a reception terminal of the reception filter is joined to a reception signal electrode pad on the substrate. First and second outer terminals are provided on the lower surface of the substrate and the first outer terminal is connected to the transmission signal electrode pad with a first wiring. A reception signal outer electrode is provided on the lower surface of the substrate and is connected to the reception signal electrode pad with a second wiring. A transmission signal outer electrode and the reception signal outer electrode are respectively arranged under the transmission signal electrode pad and the reception signal electrode pad when seen from above.

Japanese Unexamined Patent Application Publication No. 2012-65272 describes a longitudinally coupled resonator elastic wave filter in which floating dummy electrode fingers are provided so as to face gaps between interdigital transducer (IDT) electrodes to thus increase electrostatic discharge (ESD) resistance.

The pitch of electrode fingers of IDT electrodes of the surface acoustic wave filters described in WO08/146552 is narrow and there has been a problem in that ESD resistance is low. On the other hand, with Japanese Unexamined Patent Application Publication No. 2012-65272, the ESD resistance is increased by providing the floating dummy electrode fingers. However, the number of times of entrance of a surge charge from signal terminals is not necessarily once. When the dummy electrode fingers are once broken with the surge charge, the ESD resistance improvement effect is impaired.

SUMMARY OF THE INVENTION

Preferred embodiments of the present invention provide filter devices having excellent ESD resistance.

A filter device according to a preferred embodiment of the present invention includes a package substrate, and first and second filters that are mounted above the package substrate and respectively include first and second signal terminals, wherein the package substrate includes a substrate main body which includes first and second main surfaces facing each other, first and second signal electrode pads which are provided on the first main surface of the substrate main body and are respectively connected to the first and second signal terminals, first and second outer terminals which are provided on the second main surface of the substrate main body and are respectively electrically connected to the first and second signal electrode pads, and first and second wirings which respectively connect the first and second signal electrode pads and the first and second outer terminals, and the second outer terminal is arranged at the first signal electrode pad side and the first outer terminal is arranged at the second signal electrode pad side when seen in plan view.

In a filter device according to a preferred embodiment of the present invention, the first and second signal terminals of the first and second filters are respectively joined to the first and second signal electrode pads with bumps.

In a filter device according to a preferred embodiment of the present invention, the bumps are solder bumps.

In a filter device according to a preferred embodiment of the present invention, the bumps are gold bumps.

In a filter device according to a preferred embodiment of the present invention, the first and second filters are a first filter chip including the first signal terminal and a second filter chip including the second signal terminal.

In a filter device according to a preferred embodiment of the present invention, the first and second filters are one filter chip including the first and second signal terminals. In this case, the number of components is reduced.

In a filter device according to a preferred embodiment of the present invention, the substrate main body is a multilayered substrate including a plurality of substrate layers. In this case, the first and second wirings are easily provided using via hole electrodes and other suitable elements.

In a filter device according to a preferred embodiment of the present invention, the first and second wirings are located in the substrate main body. In this case, short circuiting between the first and second wirings and the outside is unlikely to occur.

In a filter device according to a preferred embodiment of the present invention, the substrate main body includes a plurality of side surfaces connecting the first main surface and the second main surface and the first wiring and the second wiring intersect with each other when seen through from one of the side surfaces. In this case, the wiring lengths of the first and second wirings are further increased and size reduction is achieved In a filter device according to a preferred embodiment of the present invention, the first and second filters are elastic wave filters.

In a filter device according to a preferred embodiment of the present invention, the elastic wave filters include IDT electrodes. In this case, in an elastic wave device including IDT electrodes, which tend to have low ESD resistance, the ESD resistance is effectively increased.

Filter devices according to preferred embodiments of the present invention effectively increase ESD resistance.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 5A to 5D are a schematic plan view of a filter device according to a fourth preferred embodiment of the present invention, a schematic plan view illustrating an electrode pattern on a second layer from the top in a substrate main body in the filter device, a schematic plan view illustrating an electrode pattern on a third layer from the top in the substrate main body in the filter device, and a schematic plan view illustrating an electrode pattern on a second main surface in the filter device, respectively.

DETAILED DESCRIPTION OF THE PREFERRED EMBODIMENTS

Preferred embodiments of the present invention will be described herein with reference to the drawings.

It should be noted that the respective preferred embodiments which are described in the specification are exemplary, and partial replacement or combination of components between different preferred embodiments may be made.

Figure 1A:
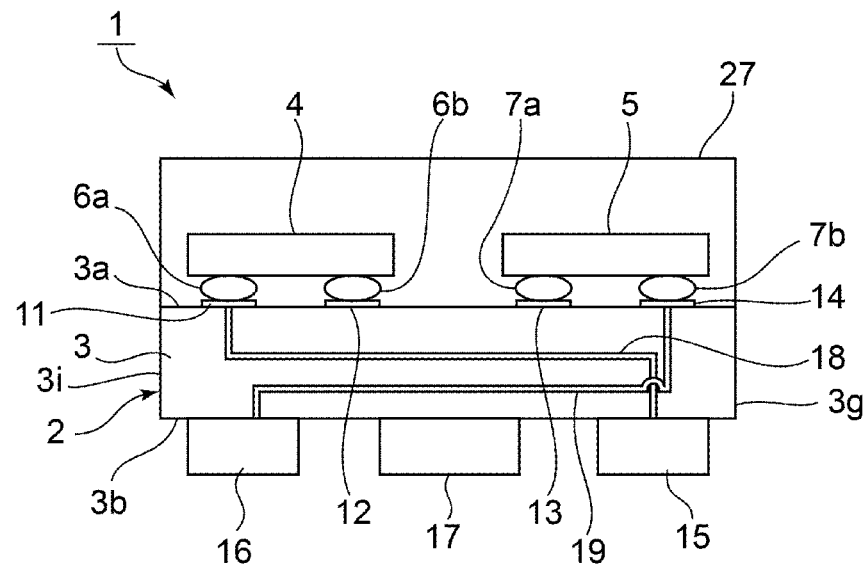
FIGS. 1A and 1B are a schematic elevational cross-sectional view and a schematic plan view of a filter device according to a first preferred embodiment of the present invention, respectively.
Figure 1B:
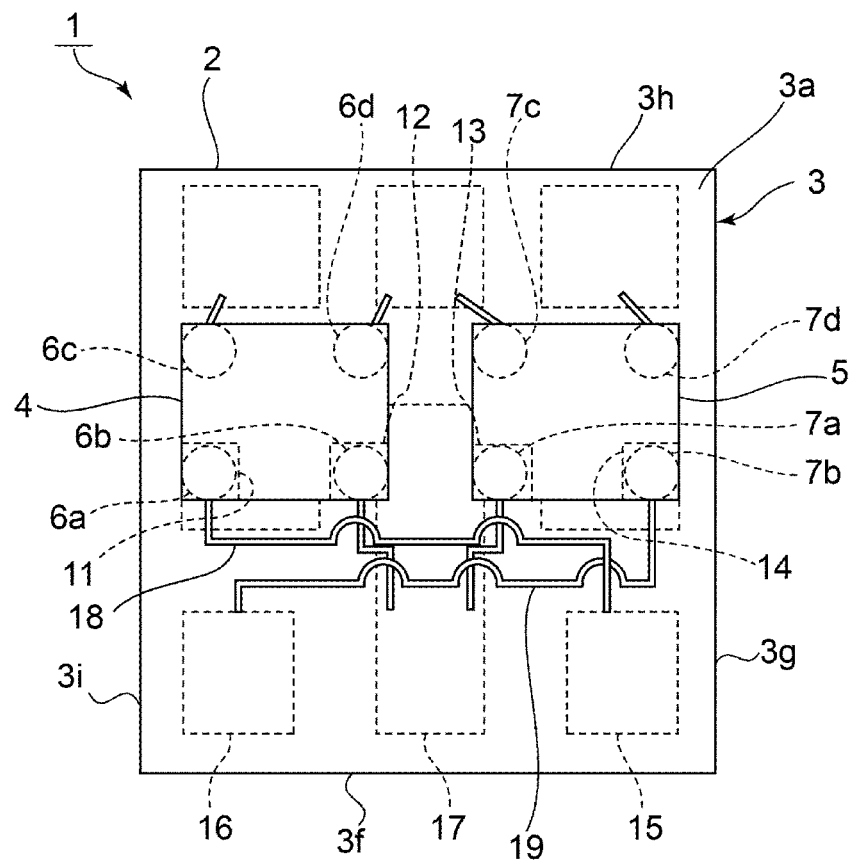
Figure 2:
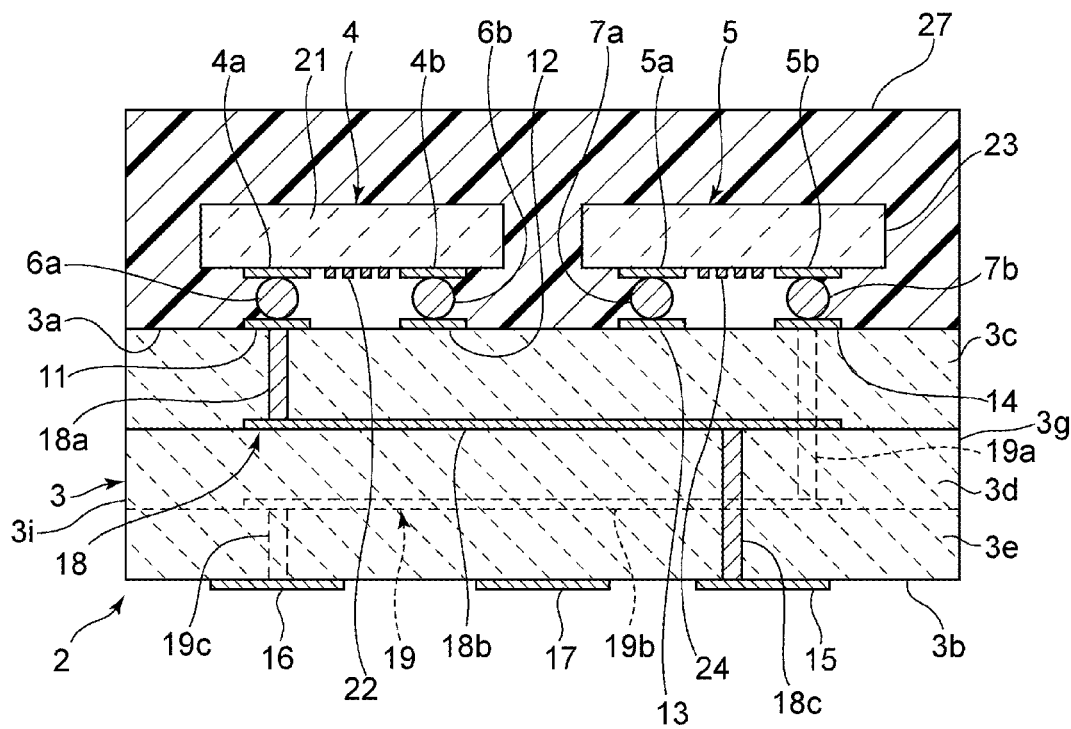
FIG. 2 is an elevational cross-sectional view of the filter device according to the first preferred embodiment of the present invention.

FIGS. 1A and 1B are a schematic elevational cross-sectional view and a schematic plan view of a filter device according to a first preferred embodiment, respectively, and FIG. 2 is an elevational cross-sectional view of the filter device.

As illustrated in FIG. 1A, a filter device 1 includes a package substrate 2. The package substrate 2 includes a substrate main body 3. The substrate main body 3 is preferably made of insulating ceramics such as alumina, synthetic resin, or other suitable materials, for example. In the present preferred embodiment, the substrate main body 3 is a multilayered substrate including a plurality of substrate layers as will be described later.

The substrate main body 3 includes first and second main surfaces 3a and 3b facing each other and a plurality of side surfaces 3f to 3i connecting the first main surface 3a and the second main surface 3b. First and second filter chips 4 and 5 are mounted above the first main surface 3a. The filter device 1 is a duplexer. The first filter chip 4 defines a transmission filter and the second filter chip 5 defines a reception filter. As indicated by dashed lines in FIG. 1B, bumps 6a to 6d are provided on the lower surface of the first filter chip 4. A plurality of bumps 7a to 7d are also provided on the lower surface of the second filter chip 5.

The first filter chip 4 is joined to the package substrate 2 with the bumps 6a to 6d. The second filter chip 5 is joined to the package substrate 2 with the bumps 7a to 7d.

The configuration in the present preferred embodiment will be described in more detail with reference to FIG. 2. In the package substrate 2, a first signal electrode pad 11, a second signal electrode pad 14, and electrode pads 12 and 13 connected to a ground potential are provided on the first main surface 3a of the substrate main body 3. A first signal terminal 4a defining a transmission terminal and a ground terminal 4b are provided on the lower surface of the first filter chip 4 defining the transmission filter chip. The first signal terminal 4a is electrically connected to the first signal electrode pad 11 with the bump 6a interposed therebetween. The ground terminal 4b is electrically connected to the electrode pad 12 with the bump 6b interposed therebetween. The electrode pad 12 is connected to the ground potential.

A second signal terminal 5b defining a reception terminal and a ground terminal 5a are provided on the lower surface of the second filter chip 5 defining the reception filter. The second signal terminal 5b is electrically connected to the second signal electrode pad 14 with the bump 7b interposed therebetween. The ground terminal 5a is electrically connected to the electrode pad 13 with the bump 7a interposed therebetween.

As illustrated in the schematic elevational cross-sectional view in FIG. 1A, a first outer terminal 15, a second outer terminal 16, and a ground outer terminal 17 are provided on the second main surface 3b of the substrate main body 3. The first signal electrode pad 11 is electrically connected to the first outer terminal 15 with a first wiring 18. The second signal electrode pad 14 is electrically connected to the second outer terminal 16 with a second wiring 19. As illustrated in FIG. 1A, the first wiring 18 and the second wiring 19 intersect with each other in the substrate main body 3 when seen through from the side surface 3f corresponding to the front side among the side surfaces 3f to 3i of the substrate main body 3. That is to say, the first wiring 18 and the second wiring 19 intersect with each other while being separated from each other with a portion of the substrate main body 3 interposed therebetween. Although the first wiring 18 and the second wiring 19 need not necessarily intersect with each other, intersection thereof in the substrate main body 3 facilitates a further increase in the wiring lengths of the first wiring 18 and the second wiring 19. Furthermore, size reduction is also achieved.

The electrode pads 12 and 13 are electrically connected to the ground outer terminal 17 with wirings (not illustrated).

FIG. 1B illustrates both of the first signal electrode pad 11 and the second signal electrode pad 14 being located over an area at which the bumps 6a and 7b are provided, respectively. In a plan view of the filter device 1 from the first main surface 3a side, as illustrated in FIG. 1B, the second outer terminal 16 is located at the first signal electrode pad 11 side and the first outer terminal 15 is located at the second signal electrode pad 14 side. That is to say, the first outer terminal 15 is located at the second signal electrode pad 14 side and the second outer terminal 16 is located at the first signal electrode pad 11 side relative to the center in the direction connecting the first signal electrode pad 11 and the second signal electrode pad 14. Therefore, as shown in FIG. 1A and FIG. 2, the first wiring 18 and the second wiring 19 are sufficiently long.

In WO08/146552 as described above, the outer terminal which is connected to the transmission terminal is located under the transmission terminal and the outer terminal which is connected to the reception terminal is located under the reception terminal. In this case, the wiring lengths are not long enough to attenuate surge charges that have entered from the outer terminals before the surge charges reach the IDT electrodes, and there has been the problem that the ESD resistance is low.

By contrast, in the filter device 1, the wiring lengths of the first and second wirings 18 and 19 are long enough to attenuate surge charges that have entered from the outer terminals before the surge charges reach IDT electrodes thus effectively increasing the ESD resistance.

In the present preferred embodiment, the first filter chip 4 and the second filter chip 5 are elastic wave filter chips. As illustrated in FIG. 2, the first filter chip 4 includes an IDT electrode 22 that is provided on one surface of a piezoelectric substrate 21. The second filter chip 5 also includes an IDT electrode 24 that is provided on one surface of a piezoelectric substrate 23. These IDT electrodes 22 and 24 have low ESD resistance. However, in the present preferred embodiment, the wiring lengths of the first and second wirings 18 and 19 are long enough as described above, thus effectively increasing the ESD resistance.

It should be noted that the piezoelectric substrates 21 and 23 made of piezoelectric single crystal or piezoelectric ceramics may be used. In the present preferred embodiment, for example, a Y-cut $LiTaO_3$ substrate with a cut angle of about 42° is preferably used.

Each of the IDT electrodes 22 and 24, the first and second signal terminals 4a and 5b, and other elements may be made of metal, such as Al, Cu, and Pt or an alloy containing any one of them as a main component, for example, and materials thereof are not particularly limited.

Furthermore, the configurations of filter circuits in the first and second filter chips 4 and 5 are not particularly limited as long as they are elastic wave filters. For example, a ladder filter may be provided as the transmission filter. A longitudinally coupled resonator elastic wave filter may be used as the reception filter.

The filter device 1 preferably has a CSP (chip scale package) structure, for example. A mold resin layer 27 covers the first and second filter chips 4 and 5. The mold resin layer 27 is preferably made of appropriate resin, such as silicon resin and epoxy resin, for example. The bumps 6a to 6d and 7a to 7d are preferably solder bumps in the present preferred embodiment. However, other metal bumps, such as gold bumps, may be used instead of the solder bumps.

In the package substrate 2, the substrate main body 3 includes first to third substrate layers 3c to 3e, as illustrated in FIG. 2. The upper surface of the first substrate layer 3c is the first main surface 3a of the substrate main body 3. A via conductor 18a penetrates through the first substrate layer 3c. The upper end of the via conductor 18a is joined to the first signal electrode pad 11. The lower end of the via conductor 18a is connected to a connection electrode 18b provided on the upper surface of the second substrate layer 3d. One end of a via conductor 18c is connected to the connection electrode 18b. The via conductor 18c penetrates through the second and third substrate layers 3d and 3e. The lower end of the via conductor 18c is joined to the first outer terminal 15. The first wiring 18 defined by the via conductor 18a, the connection electrode 18b, and the via conductor 18c is thus provided.

In the same or similar manner, the second wiring 19 includes a via conductor 19a, a connection electrode 19b, and a via conductor 19c. The via conductor 19a penetrates through the first and second substrate layers 3c and 3d. The connection electrode 19b is provided on the upper surface of the third substrate layer 3e. The via conductor 19c penetrates through the third substrate layer 3e.

Each of the via conductors 18a and 18c, via conductors 19a and 19c, and connection electrodes 18b and 19b is made of appropriate metal or an appropriate alloy. Each of the first and second outer terminals 15 and 16 and the ground outer terminal 17 is also similarly made of appropriate metal or an appropriate alloy.

Figure 3:
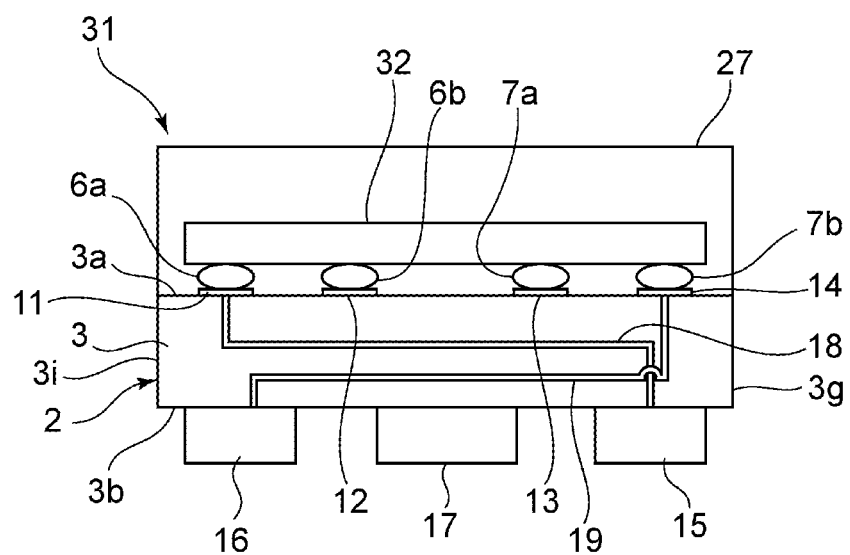
FIG. 3 is a schematic elevational cross-sectional view of a filter device according to a second preferred embodiment of the present invention.

FIG. 3 is a schematic elevational cross-sectional view of a filter device 31 according to a second preferred embodiment of the present invention. One filter chip 32 is mounted above the package substrate 2 in the filter device 31. That is to say, the first filter chip 4 and the second filter chip 5 in the first preferred embodiment are integrated with each other using one piezoelectric substrate. Other configurations of the filter device 31 are the same or substantially the same as those of the filter device 1 and detailed description thereof is omitted as the description thereof is the same or substantially the same as that of the filter device 1. As in the second preferred embodiment, a plurality of filter chips may be integrated to define the single filter chip 32. Also, in this case, the first outer terminal 15 is located at the second signal electrode pad 14 side and the second outer terminal 16 is located at the first signal electrode pad 11 side in a plan view from the first main surface 3a side. Therefore, the first and second wirings 18 and 19 are sufficiently long. Accordingly, the ESD resistance is effectively increased as in the first preferred embodiment.

Figure 4A:
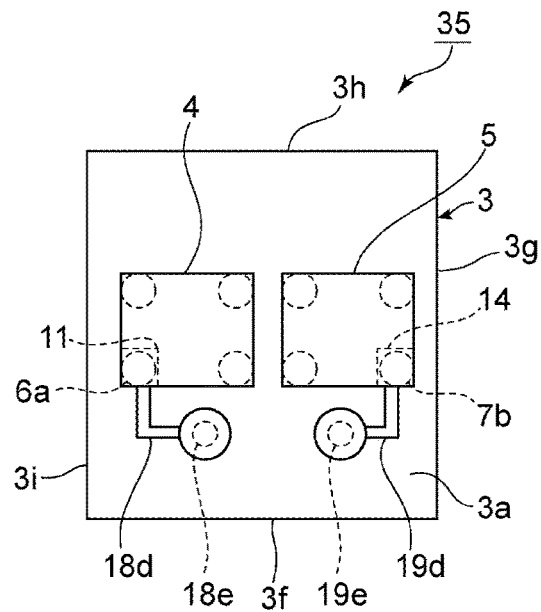
FIGS. 4A to 4C are a schematic plan view of a filter device according to a third preferred embodiment of the present invention, a schematic plan view illustrating an electrode pattern on an intermediate layer in a substrate main body in the filter device, and a schematic plan view illustrating an electrode pattern on a second main surface in the filter device, respectively.
Figure 4C:
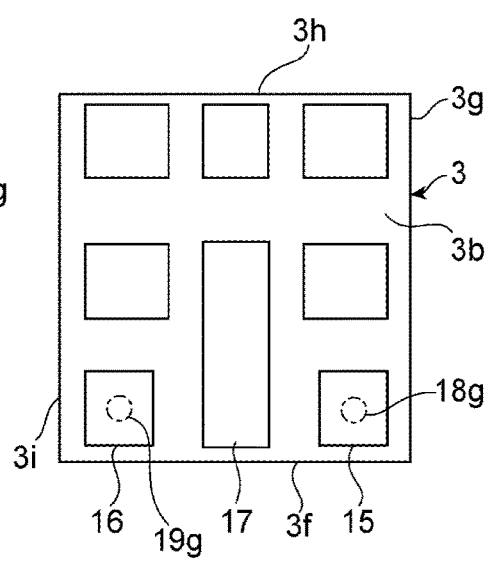
Figure 4B:
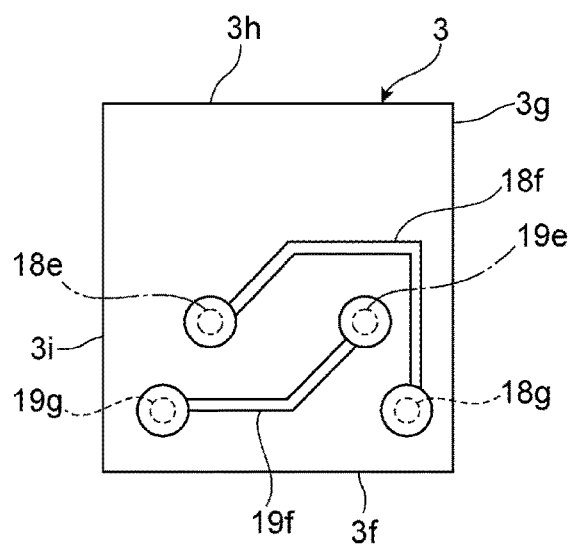

FIGS. 4A to 4C are a schematic plan view of a filter device according to a third preferred embodiment of the present invention, a schematic plan view illustrating an electrode pattern on an intermediate layer in a substrate main body in the filter device, and a schematic plan view illustrating an electrode pattern on a second main surface in the filter device, respectively.

In a filter device 35 according to the third preferred embodiment, the first wiring 18 and the second wiring 19 are different from those in the first preferred embodiment. Other configurations thereof are the same or substantially the same as those in the first preferred embodiment. The first wiring 18 includes a wiring portion 18d, a via conductor 18e, a connection electrode 18f, and a via conductor 18g. The wiring portion 18d is provided on the first main surface 3a of the substrate main body 3. One end of the wiring portion 18d is connected to the first signal electrode pad 11. The upper end of the via conductor 18e is connected to the wiring portion 18d and the lower end of the via conductor 18e is connected to the connection electrode 18f. The upper end of the via conductor 18g is connected to the connection electrode 18f. It should be noted that in the accompanying drawings of the present specification, the upper ends of the via conductors are indicated by dashed lines as the via conductor 18e in FIG. 4A is indicated by a dashed line. Furthermore, the lower ends of the via conductors are indicated by dashed-dotted lines as the via conductor 18e is indicated by a dashed-dotted line in FIG. 4B.

The second wiring 19 includes a wiring portion 19d, a via conductor 19e, a connection electrode 19f, and a via conductor 19g. The wiring portion 19d is provided on the first main surface 3a of the substrate main body 3. One end of the wiring portion 19d is connected to the second signal electrode pad 14. The upper end of the via conductor 19e is connected to the wiring portion 19d and the lower end of the via conductor 19e is connected to the connection electrode 19f. The upper end of the via conductor 19g is connected to the connection electrode 19f. The connection electrode 18f is bent in one corner portion on the intermediate layer of the substrate main body 3. Accordingly, the first wiring 18 has more sufficient length.

Also, similarly in the second wiring 19, the connection electrode 19f extends to the via conductor 19g side from the via conductor 19e side and includes a bent portion between the via conductor 19g side and the via conductor 19e side. Accordingly, the second wiring 19 also has more sufficient length.

Also, in the filter device 35, the first outer terminal 15 is located at the second signal electrode pad 14 side and the second outer terminal 16 is located at the first signal electrode pad 11 side in a plan view from the first main surface 3a side. Therefore, the first and second wirings 18 and 19 are sufficiently long.

FIGS. 5A to 5D are a schematic plan view of a filter device according to a fourth preferred embodiment of the present invention, a schematic plan view illustrating an electrode pattern on a second layer from the top in a substrate main body in the filter device, a schematic plan view illustrating an electrode pattern on a third layer from the top in the substrate main body in the filter device, and a schematic plan view illustrating an electrode pattern on a second main surface in the filter device, respectively.

In a filter device 41 according to the fourth preferred embodiment, one filter chip 42 is mounted above the substrate main body 3. The filter chip 42 is a filter chip integrally including a transmission filter and a reception filter in the same or similar manner as the second preferred embodiment. The bumps 6a and 7b are respectively joined to a transmission terminal and a reception terminal.

The bumps 6a and 7b are respectively joined to the first signal electrode pad 11 and the second signal electrode pad 14.

As is apparent from a comparison between FIGS. 5D and 5A, the first outer terminal 15 is located at the second signal electrode pad 14 side and the second outer terminal 16 is located at the first signal electrode pad 11 side in a plan view from the first main surface 3a side. Accordingly, in the present preferred embodiment, the first and second wirings 18 and 19 are sufficiently long. Therefore, the ESD resistance is increased. It should be noted that the first wiring 18 includes a wiring portion 18h, a via conductor 18i, a connection electrode 18j, and a via conductor 18k. The wiring portion 18h is located on the first main surface 3a of the substrate main body 3. The upper end of the via conductor 18i is connected to the wiring portion 18h and the lower end thereof is connected to the connection electrode 18j. The connection electrode 18j is structured as illustrated in FIG. 5B and, therefore, has a more sufficient length. The upper end of the via conductor 18k is connected to the connection electrode 18j and the lower end thereof is connected to the first outer terminal 15.

The second wiring 19 includes a wiring portion 19h, a via conductor 19i, a connection electrode 19j, and a via conductor 19k. The wiring portion 19h is located on the first main surface 3a. The upper end of the via conductor 19i is connected to the wiring portion 19h and the lower end thereof is connected to the connection electrode 19j. The upper end of the via conductor 19k is connected to the connection electrode 19j and the lower end thereof is connected to the second outer terminal 16.

As is apparent from the second to fourth preferred embodiments, each of the first wiring 18 and the second wiring 19 is easily provided by combining the via conductors and the connection electrode. In addition, the wiring lengths of the first and second wirings 18 and 19 are easily increased by, for example, adjusting routing configurations of the connection electrodes. Accordingly, it is preferable for the first and second wirings 18 and 19 to be provided in the substrate main body 3.

The first and second wirings 18 and 19 may pass through the outer surface of the substrate main body 3.

Furthermore, the first and second filter chips 4 and 5, the filter chip 32, and other chips may be elastic wave filters other than the surface acoustic wave filters including the IDT electrodes. The first filter and the second filter are not limited to the elastic wave filters and may be other bandpass filters in the present invention. Also, in this case, according to the preferred embodiments of present invention, the first and second wirings are sufficiently long. Therefore, the ESD resistance is effectively increased.

Figure 6:
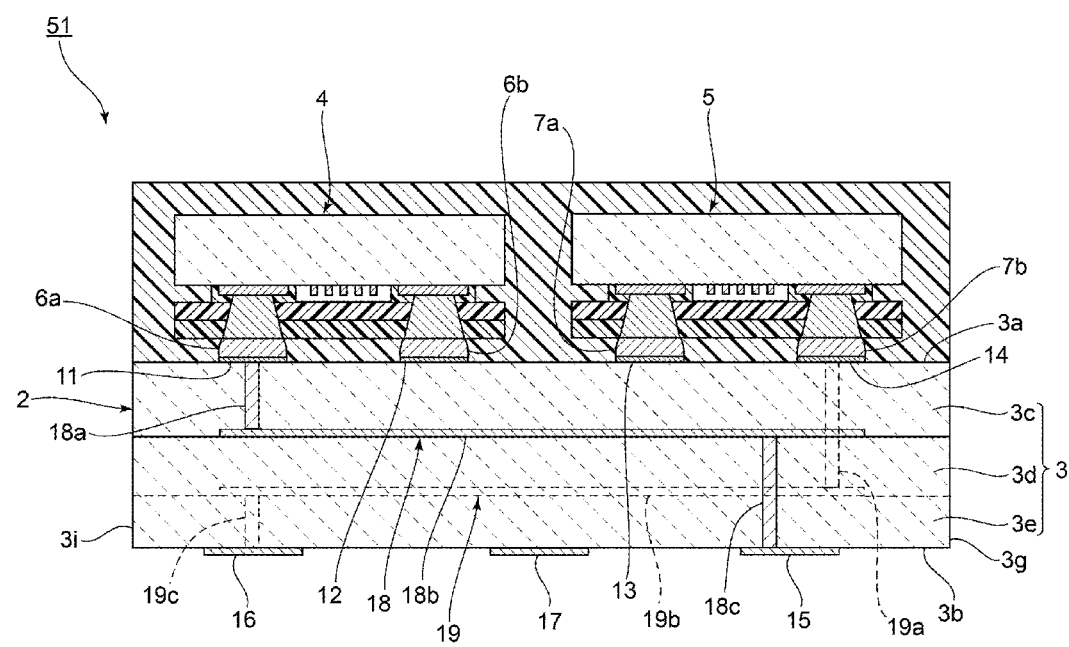
FIG. 6 is an elevational cross-sectional view of an elastic wave device according to a fifth preferred embodiment of the present invention.

Although the CSP package structure is used in the first preferred embodiment as illustrated in FIG. 2, a wafer level package (WLP) package structure may be used as in a fifth preferred embodiment of the present invention illustrated in FIG. 6. In a filter device 51 illustrated in FIG. 6, a WLP elastic wave filter device is mounted using the substrate main body 3 configured in the same or similar manner as the first preferred embodiment. Also, in the present preferred embodiment, the first outer terminal 15 is located at the second signal electrode pad 14 side and the second outer terminal 16 is located at the first signal electrode pad 11 side. Therefore, the first and second wirings 18 and 19 is sufficiently long.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   a package substrate; and
   first and second filters that are mounted above the package substrate and respectively include first and second signal terminals; wherein
   the package substrate includes:
     a substrate main body which includes first and second main surfaces facing each other;
     first and second signal electrode pads which are provided on the first main surface of the substrate main body and are respectively connected to the first and second signal terminals;
     first and second outer terminals which are provided on the second main surface of the substrate main body and are respectively electrically connected to the first and second signal electrode pads; and
     first and second wirings which respectively connect the first and second signal electrode pads and the first and second outer terminals;
   the second outer terminal is located at a side of the first signal electrode pad and the first outer terminal is located at a side of the second signal electrode pad when seen in plan view; and
   at least one of the first outer terminal and the second outer terminal is connected to only one of the first filter and the second filter.

2. The filter device according to claim 1, wherein the first and second signal terminals of the first and second filters are respectively joined to the first and second signal electrode pads with bumps.

3. The filter device according to claim 2, wherein the bumps are solder bumps.

4. The filter device according to claim 2, wherein the bumps are gold bumps.

5. The filter device according to claim 1, wherein the first and second filters include a first filter chip including the first signal terminal and a second filter chip including the second signal terminal.

6. The filter device according to claim 1, wherein the first and second filters are defined by one filter chip including the first and second signal terminals.

7. The filter device according to claim 1, wherein the substrate main body is a multilayered substrate including a plurality of substrate layers.

8. The filter device according to claim 1, wherein the first and second wirings are located in the substrate main body.

9. The filter device according to claim 8, wherein
the substrate main body includes a plurality of side surfaces connecting the first main surface and the second main surface; and
the first wiring and the second wiring intersect each other when seen through from one of the side surfaces.

10. The filter device according to claim 9, wherein the first wiring and the second wiring intersect each other with a portion of the substrate main body therebetween.

11. The filter device according to claim 1, wherein the first and second filters are elastic wave filters.

12. The filter device according to claim 11, wherein the elastic wave filters include IDT electrodes.

13. The filter device according to claim 12, wherein the elastic wave filters further include a piezoelectric substrate on which the IDT electrodes of the first and second filters are provided.

14. The filter device according to claim 13, wherein the piezoelectric substrate is a Y-cut $LiTaO_3$ substrate with a cut angle of about 42°.

15. The filter device according to claim 12, wherein the IDT electrodes are made of at least one of Al, Cu, Pt, or an alloy containing any one of Al, Cu, Pt as a main component.

16. The filter device according to claim 12, wherein the elastic wave filters further include a first piezoelectric substrate on which the IDT electrodes of the first filter are provided, and a second piezoelectric substrate on which the IDT electrodes of the second filter are provided.

17. The filter device according to claim 16, wherein at least one of the first piezoelectric substrate and the second piezoelectric substrate is a Y-cut $LiTaO_3$ substrate with a cut angle of about 42°.

18. The filter device according to claim 1, wherein the first and second filters are covered with a mold resin layer.

19. The filter device according to claim 18, wherein the mold resin layer is made of silicon resin or epoxy resin.

20. The filter device according to claim 1, wherein the first filter is a transmission filter, and the second filter is a reception filter.

21. The filter device according to claim 20, wherein the transmission filter is a ladder filter and the reception filter is a longitudinally coupled resonator elastic wave filter.

* * * * *